(12) United States Patent
Givant

(10) Patent No.: US 10,074,438 B2
(45) Date of Patent: Sep. 11, 2018

(54) METHODS AND DEVICES FOR REDUCING PROGRAM DISTURB IN NON-VOLATILE MEMORY CELL ARRAYS

(71) Applicant: Cypress Semiconductor Corporation, San Jose, CA (US)

(72) Inventor: Amichai Givant, Rosh HaAyin (IL)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 15/279,194

(22) Filed: Sep. 28, 2016

(65) Prior Publication Data

US 2017/0358367 A1 Dec. 14, 2017

Related U.S. Application Data

(60) Provisional application No. 62/348,579, filed on Jun. 10, 2016.

(51) Int. Cl.
| | | |
|---|---|---|
| G11C 11/34 | (2006.01) |
| G11C 16/34 | (2006.01) |
| G11C 16/04 | (2006.01) |
| G11C 16/10 | (2006.01) |
| H01L 23/522 | (2006.01) |
| H01L 27/11565 | (2017.01) |
| H01L 27/1157 | (2017.01) |
| H01L 29/423 | (2006.01) |
| H01L 29/792 | (2006.01) |

(52) U.S. Cl.
CPC ...... G11C 16/3427 (2013.01); G11C 16/0466 (2013.01); G11C 16/10 (2013.01); H01L 23/5226 (2013.01); H01L 27/1157 (2013.01); H01L 27/11565 (2013.01); H01L 29/42344 (2013.01); H01L 29/7923 (2013.01)

(58) Field of Classification Search
CPC . G11C 16/3427; G11C 16/10; G11C 16/0466; H01L 27/1157; H01L 29/42344; H01L 29/7923
USPC .......................... 365/185.02, 185.05, 185.11
See application file for complete search history.

(56) References Cited

U.S. PATENT DOCUMENTS

| | | | | |
|---|---|---|---|---|
| 5,706,228 A | * | 1/1998 | Chang | ................ G11C 16/0433 365/185.02 |
| 5,721,704 A | * | 2/1998 | Morton | ................ G11C 16/08 365/185.23 |
| 5,945,717 A | | 8/1999 | Chevallier | |

(Continued)

FOREIGN PATENT DOCUMENTS

EP 1599881 B1 12/2010

OTHER PUBLICATIONS

Rohit S Shenoy, et al., "MIEC (mixed-ionic-electronic-conduction)-based access devices for non-volatile crossbar memory arrays," IOP Publishing, Semicond. Sci. Technol. 29, 104005, Sep. 18, 2014; pp. 1-11; 11 pages.

(Continued)

*Primary Examiner* — Viet Q Nguyen

(57) ABSTRACT

A memory device that includes a pair of non-volatile memory cells, a first memory cell including a first memory gate and a first select gate, and a second memory cell including a second memory gate and a second select gate. The first and second memory cells share a source line, and the first and second memory gates are not connected to one another.

17 Claims, 9 Drawing Sheets

(56) References Cited

U.S. PATENT DOCUMENTS

| | | | |
|---|---|---|---|
| 5,978,267 A | 11/1999 | Chen et al. | |
| 6,400,603 B1* | 6/2002 | Blyth | G11C 16/0408 365/185.11 |
| 6,438,028 B1* | 8/2002 | Kobayashi | G11C 16/0425 257/E21.682 |
| 6,587,381 B2 | 7/2003 | Kanai et al. | |
| 6,717,846 B1 | 4/2004 | Lee et al. | |
| 7,110,295 B2 | 9/2006 | Ishikawa et al. | |
| 7,130,223 B2 | 10/2006 | Ishimaru et al. | |
| 7,253,055 B2 | 8/2007 | Mokhlesi et al. | |
| 7,269,063 B2 | 9/2007 | Chih | |
| 7,286,401 B2 | 10/2007 | Ishimaru et al. | |
| 7,339,827 B2* | 3/2008 | Yasui | G11C 16/0466 257/E27.103 |
| 7,667,259 B2* | 2/2010 | Yasui | H01L 27/115 257/314 |
| 7,696,038 B1 | 4/2010 | Cheng et al. | |
| 7,952,937 B2 | 5/2011 | Bode | |
| 7,974,127 B2 | 7/2011 | Chong et al. | |
| 8,045,373 B2 | 10/2011 | Jenne et al. | |
| 8,164,950 B2 | 4/2012 | Torsi et al. | |
| 8,174,901 B2 | 5/2012 | Matsubara et al. | |
| 8,492,826 B2* | 7/2013 | Ajika | H01L 27/11568 257/324 |
| 8,497,547 B2* | 7/2013 | Toba | H01L 21/28282 257/316 |
| 9,123,425 B2 | 9/2015 | Dong et al. | |
| 9,443,579 B2 | 9/2016 | Lee | |
| 9,455,352 B2 | 9/2016 | Cheng et al. | |
| 9,508,430 B2 | 11/2016 | Murooka | |
| 9,570,079 B1* | 2/2017 | Gorthi | G10L 17/005 |
| 9,590,059 B2* | 3/2017 | Chuang | H01L 29/408 |
| 9,673,210 B1* | 6/2017 | Thees | H01L 27/1157 |
| 2003/0034510 A1* | 2/2003 | Liu | G11C 16/0425 257/296 |
| 2003/0039146 A1* | 2/2003 | Choi | G11C 16/0433 365/185.33 |
| 2003/0145154 A1* | 7/2003 | Barnett | G11C 16/30 711/103 |
| 2004/0027856 A1* | 2/2004 | Lee | G11C 16/0408 365/185.11 |
| 2005/0017287 A1* | 1/2005 | Chih | H01L 27/115 257/314 |
| 2005/0135155 A1* | 6/2005 | Ishimaru | G11C 16/0425 365/185.25 |
| 2005/0179079 A1* | 8/2005 | Wu | G11C 11/5628 257/316 |
| 2005/0185464 A1* | 8/2005 | Chih | G11C 16/0425 365/185.11 |
| 2006/0028868 A1* | 2/2006 | Okazaki | G11C 16/0425 365/185.05 |
| 2006/0083089 A1 | 4/2006 | Chevallier | |
| 2007/0070703 A1* | 3/2007 | Tran | G11C 8/10 365/185.22 |
| 2007/0086247 A1 | 4/2007 | Lutze et al. | |
| 2008/0247255 A1 | 10/2008 | Syzdek et al. | |
| 2009/0050956 A1* | 2/2009 | Ishimaru | H01L 27/115 257/324 |
| 2011/0157982 A1* | 6/2011 | Lee | G11C 16/0425 365/185.03 |
| 2012/0063223 A1* | 3/2012 | Lee | G11C 16/0433 365/185.02 |
| 2012/0139025 A1* | 6/2012 | Gely | G11C 16/0433 257/316 |
| 2012/0147651 A1 | 6/2012 | Scheuerlein et al. | |
| 2013/0034313 A1 | 2/2013 | Lin et al. | |
| 2013/0088916 A1* | 4/2013 | Sarpatwari | G11C 16/0483 365/185.02 |
| 2013/0250687 A1 | 9/2013 | Chan | |
| 2013/0343123 A2 | 12/2013 | Kim | |
| 2014/0104965 A1* | 4/2014 | Tran | G11C 5/145 365/189.011 |
| 2014/0119121 A1 | 5/2014 | Aritome | |
| 2014/0269058 A1* | 9/2014 | Liu | G11C 11/5628 365/185.03 |
| 2015/0287732 A1* | 10/2015 | Tsao | G11C 5/06 257/319 |
| 2015/0303208 A1* | 10/2015 | Kim | H01L 27/11524 257/300 |
| 2015/0325300 A1 | 11/2015 | Kim et al. | |
| 2016/0125945 A1 | 5/2016 | Maejima | |
| 2016/0225453 A1 | 8/2016 | Kashihara | |
| 2016/0314846 A1* | 10/2016 | Muller | G11C 16/08 |
| 2017/0194056 A1* | 7/2017 | Heinrich-Barna | G11C 16/3427 |

OTHER PUBLICATIONS

Sung-Jin Choi and Yang-Kyu Choi, "Source and Drain Junction Engineering for Enhanced Non-Volatile Memory Performance," INTECH, Sep. 6, 2011, pp. 177-197; 7 pages.

Yoshio Nishi, "Advances in Non-volatile Memory and Storage Technology," Woodhead Publishing Series in Electronic and Optical Materials, No. 64, pp. 7; 1 page.

International Search Report for International Application No. PCT/US17/17452 dated Apr. 28, 2017; 2 pages.

USPTO Restriction Requirement for U.S. Appl. No. 15/471,418 dated Jun. 13, 2017; 6 pages.

Written Opinion of the International Searching Authority for International Application No. PCT/US17/17452 dated Apr. 28, 2017; 5 pages.

USPTO Final Rejection for U.S. Appl. No. 15/471,418 dated Nov. 27, 2017; 9 pages.

USPTO Non-Final Rejection for U.S. Appl. No. 15/471,418 dated Sep. 7, 2017; 8 pages.

International Search Report for International Application No. PCT/US17/46698 dated Nov. 3, 2017; 2 pages.

Written Opinion of the International Searching Authority for International Application No. PCT/US17/46698 dated Nov. 3, 2017; 6 pages.

USPTO Advisory Action for U.S. Appl. No. 15/471,418 dated Feb. 15, 2018; 2 pages.

USPTO Applicant-Initiated Interview Summary for U.S. Appl. No. 15/471,418 dated Feb. 7, 2018; 3 pages.

USPTO Non Final Rejection for U.S. Appl. No. 15/954,955 dated Jun. 13, 2018; 12 pages.

USPTO Notice of Allowance for U.S. Appl. No. 15/471,418 dated Mar. 9, 2018; 8 pages.

TIPO Office Action for Taiwan Patent Application No. 106141889 dated Jul. 5, 2018; 12 pages.

* cited by examiner

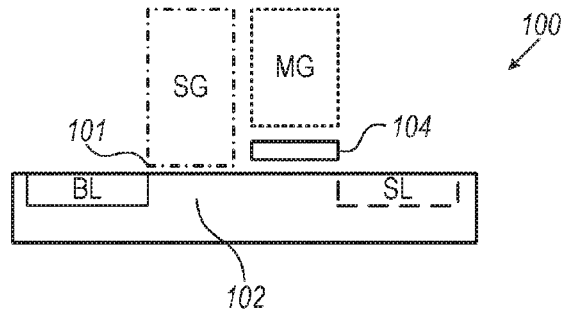
*FIG. 1*
*FIG. 2*
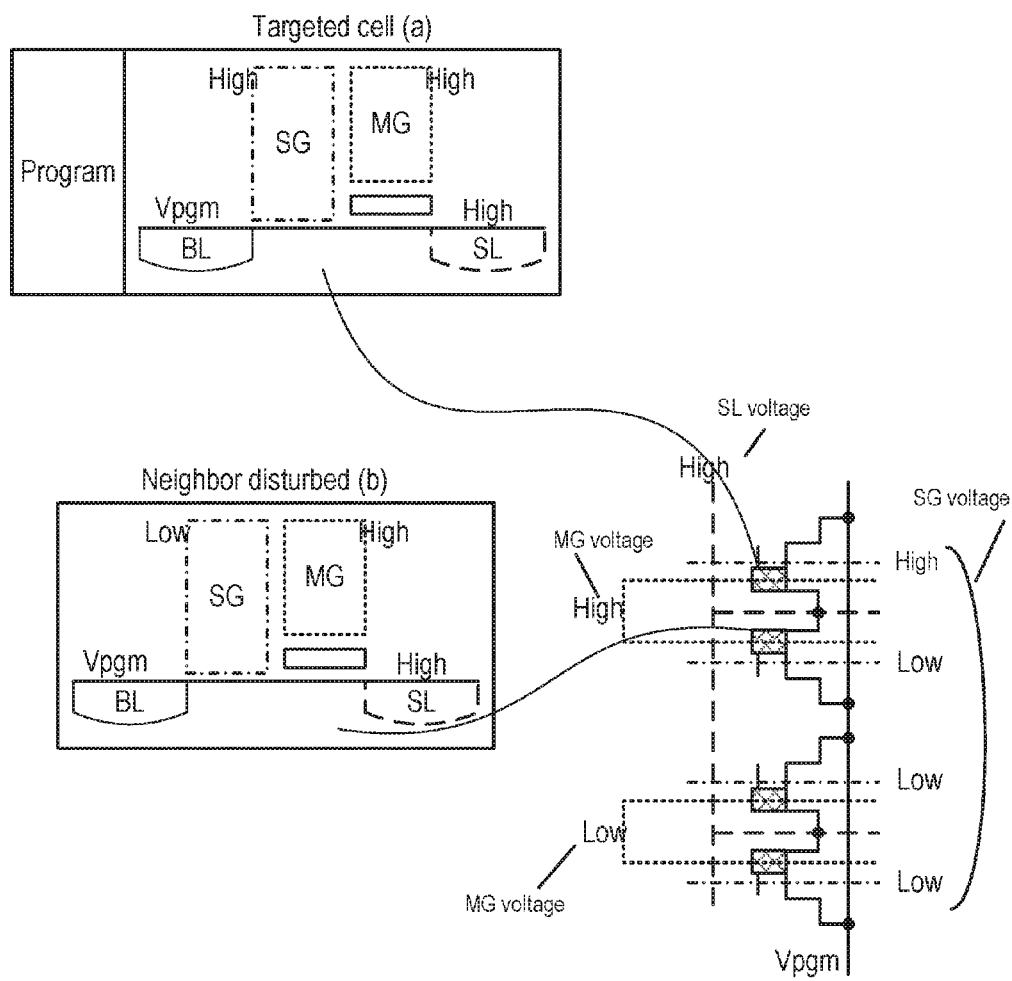

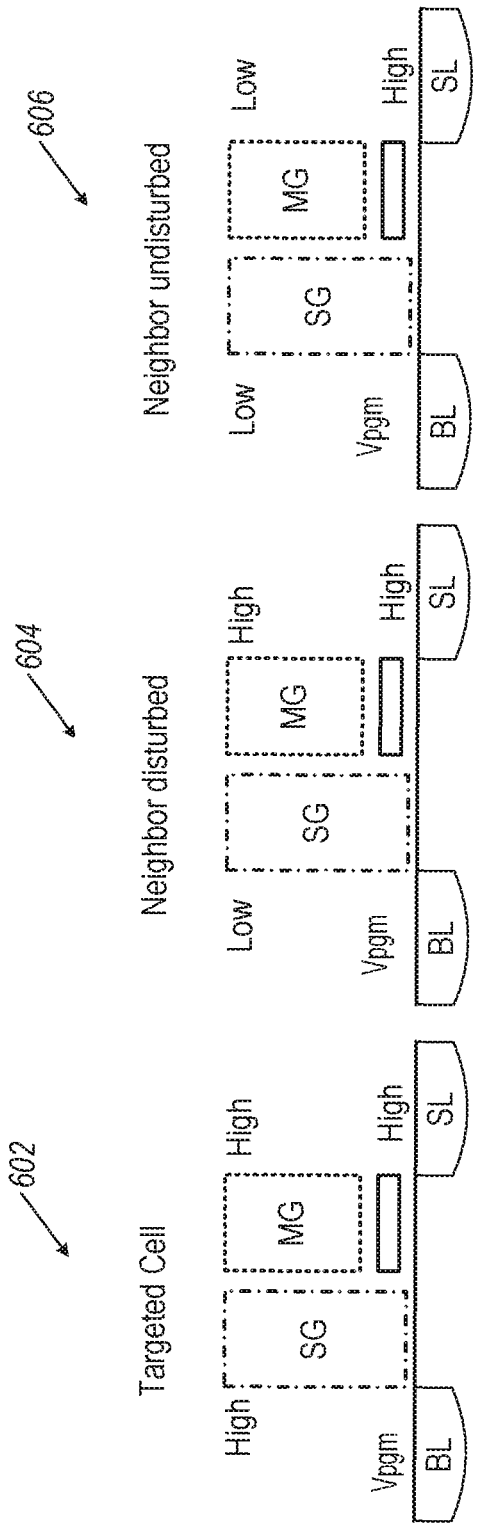

METHODS AND DEVICES FOR REDUCING PROGRAM DISTURB IN NON-VOLATILE MEMORY CELL ARRAYS

CROSS-REFERENCE TO RELATED APPLICATIONS

The present application claims the priority and benefit of U.S. Provisional Application No. 62/348,579, filed on Jun. 10, 2016, which is incorporated by reference herein in its entirety.

FIELD OF THE INVENTION

The present invention relates generally to the field of non-volatile memory (NVM) arrays. More specifically, the present invention relates to methods, circuits, devices and systems for reducing program disturb in NVM arrays.

BACKGROUND

Integrated circuits (IC) may be used in a wide range of designs and products, some integrated circuits may include Non-Volatile Memory (NVM) arrays. An NVM array may be composed of NVM cells, ancillary circuitry, a controller and additional circuits. The ancillary circuitry may include for example: array controls, address decoding circuits and sense amplifiers (SA). SAs may be configured to determine a value/level of one or more targeted NVM cell.

NVM devices may include an NVM array. Some memory array types may include NVM arrays, floating gate arrays, charge trapping cell arrays (such as array of eCT™ cells, array of MirrorBit® cells) and more.

The NVM cells may be single bit or multi-bit storage cells and the cells may be programmable to different states, for example in a single bit configuration the cell may be programmable to either an erased (ERS) or programmed (PRG) state.

According to some embodiments, the NVM cells may be accessed through word lines (WLs), bitlines (BLs), source lines (SLs), select gates (SGs), memory gates (MGs) or otherwise. For each operational mode (Programming of cells, Erasing of cells, Reading of cells etc.) the WLs, BLs, SLs, SGs and/or MGs may be activated and operated accordingly. Operating mode, such as read algorithm, program algorithm, erase algorithm, may determine voltage or current signals applied to WLs, SLs, SGs, MGs of NVM cells. Other factors include the selected addresses, the specific technology being used. In some embodiments, the NVM arrays may include different structural features and may not include SGs, BLs, SLs, MGs and/or WLs, or otherwise.

Some other types of transistors which may also be included in associated circuitry, such as P-type metal-oxide-semiconductor transistors (Pmos), N-type metal-oxide-semiconductor transistors (Nmos), low voltage (LV) Nmos, LV Pmos, high voltage (HV) Nmos and HV Pmos, Zmos which is a low resistance Nmos or Pmos type transistor, bipolar junction transistors (BJT) and more. HV transistors/cells may be differentiated from LV transistors/cells by being designed/configured to enable operation in a higher range of voltages across their channel compared to LV cells (for example, between a drain node and a source node of the transistor) and/or across the gate (for example: between their gate and bulk or ground node). HV devices may include a thick gate oxide region compared to LV devices. FIG. 1 depicts an example split-gate eCT™ cell. Split gate device 100 includes Select Gate (SG) with a thin oxide 101 underneath. The SG may be utilized to control opening and closing of the channel 102 beneath. Device 100 further includes Memory Gate (MG) with a charge trapping layer 104 that is the used to store electrical charges representing data. The MG may be utilized to control charge trapping layer 104. As discussed above, operation of BL, SG, MG and SL may cause device 100 to be programmed, erased and/or read.

SUMMARY OF THE INVENTION

According to some embodiments, a memory device may include: (a) a target memory cell including: a first select gate, a target memory gate and a first source line where during a program operation the first select gate, target memory gate and first source line are at program state levels, and (b) a neighbor memory cell including: a second select gate, the first source line and a neighbor memory gate which is unconnected to the target memory gate. During a program operation the neighbor select gate may be at an inhibit state to inhibit program disturb on the neighbor cell.

According to some embodiments, a memory device may include: an array of memory cells including a plurality of regular pairs of memory cells each pair including: (a) a target memory cell including: a first select gate, a target memory gate and a first source line where during a program operation the first select gate, target memory gate and first source line are at program state levels; and (b) a neighbor memory cell including: a second select gate, the first source line and a neighbor memory gate which is unconnected to the target memory gate. During a program operation the neighbor select gate is at an inhibit state to inhibit program disturb on the neighbor cell.

According to some embodiments, a method of programming a memory device, the memory device including a plurality of odd and even memory cell pairs each where each couple has a shared bit line and odd and even memory gates and odd and even select gates, where the odd and even memory gates are unconnected is understood. The method may include: applying a program voltage to the even memory gate, applying a closed/low voltage to the odd memory gate, and applying an inhibiting voltage to the odd select gate. Optionally, the method may include applying a high/program voltage to the odd memory gate while applying a closed/low voltage to the even memory gate and an inhibiting voltage to the even select gate.

According to some embodiments, an adjacent memory cell may include: a third select gate, an adjacent memory gate which is connected to the target memory gate and a third source line which is unshared with the target memory cell. The unshared SL is physically not the same SL as the target memory cell however they may be electronically connected or may be driven to substantially the same voltage. It is understood that the physical separation effects susceptibility to program disturb as will be discussed in the detailed description. The target memory cell may further include a first bitline and the neighbor memory cell may further include a second bitline. These two bitlines as well as additional bitline in the array may be supplied with the same voltages (i.e. electronically connected) and/or may be physically connected.

According to some embodiments, the array may further include an edge pair of memory cells including: (a) an edge target memory cell including: a first edge select gate, a first edge memory gate and a first edge source line; wherein during a program operation the first edge select gate, first edge memory gate and first edge source line are at program state levels; and (b) a second edge memory cell including: a second edge select gate, a second edge memory gate which is connected to the first edge memory gate and an unshared edge source line which is different than the first edge source line. Optionally, during a program operation the second edge select gate is at an inhibit state. Furthermore, two or more regular pairs of memory cells may be connected at their memory gates. A regular pair and an edge pair of memory cells may be electronically connected at their memory gates. Optionally, the array may include a conducting bridge to connect the regular pair with the edge pair of memory cells. Furthermore, the source line of the edge may have a different voltage than source line of the edge neighbor.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 1 depicts an example of a split-gate non-volatile memory (NVM) cell, such as the eCT™ cell;

FIG. 2 depicts cell view schematics including marked operating voltage levels for a program operation for the NVM cells for both a targeted and a neighbor cell and an associated cut out of an array including a targeted or target cell and a neighbor cell;

FIGS. 5A, 5B; and 50 depict example cell voltages during a program operation for various cell types;

Figure 3:
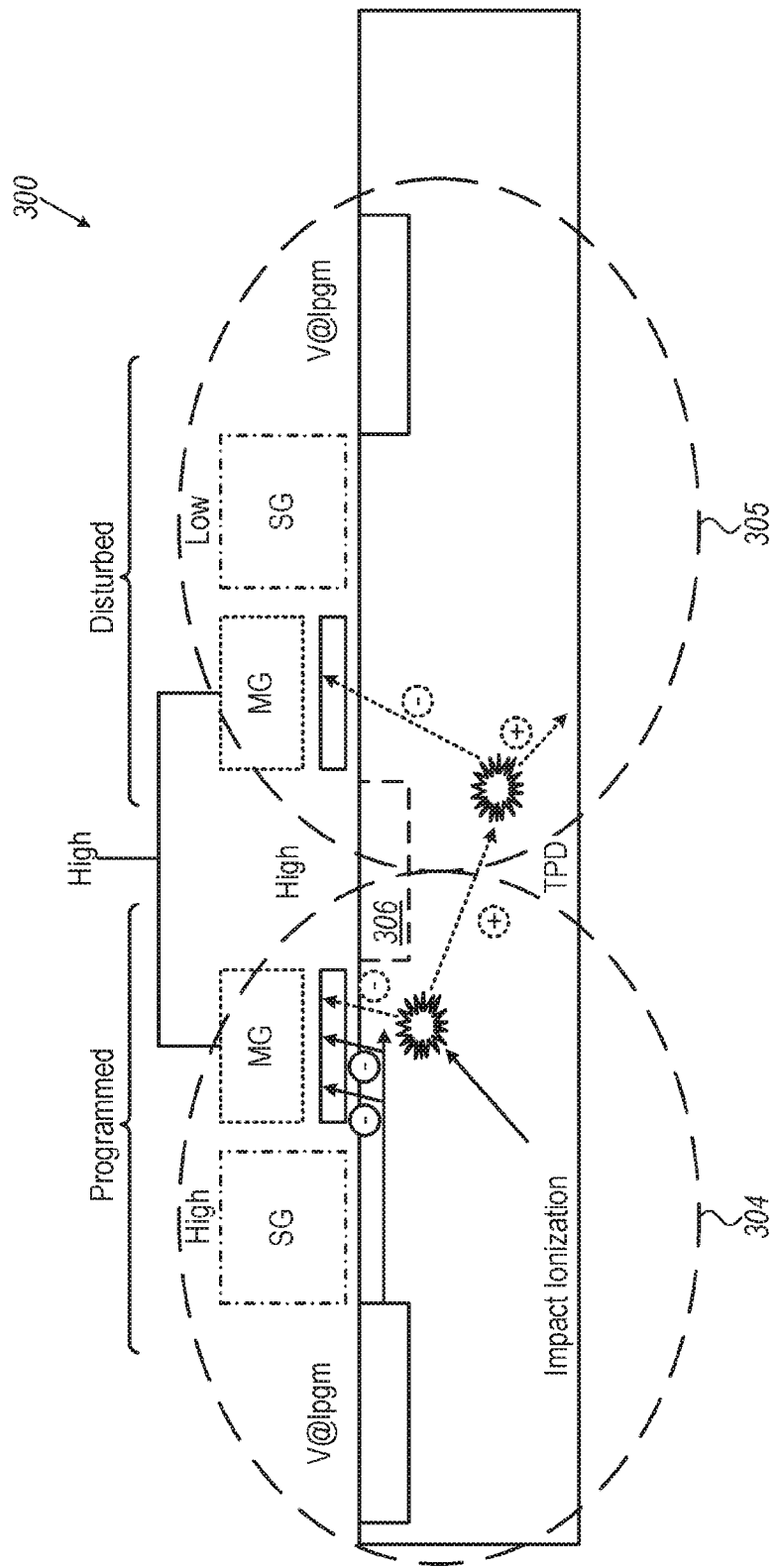
FIG. 3 shows a program disturb depicted for two neighboring NVM cells.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Unless specifically stated otherwise, as apparent from the following discussions, it is appreciated that throughout the specification discussions utilizing terms such as "processing", "computing", "calculating", "determining", or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

The present invention may include methods, circuits, devices, systems and functionally associated machine executable code for reducing disturb effects in Non-Volatile Memory (NVM) Arrays.

According to some embodiments, programming of a cell in a memory array may cause a disturb effect in one or more neighbor cells such as a parasitic programming disturb effect. According to some embodiments, array architecture and/or program voltage supply optimization may reduce a disturb effect on neighbor cells such as a shifted memory gate array architecture which will be discussed in more detail below one embodiment, neighboring cells may be described as memory cells that are physically adjacent to one another and share a common source line (SL). One cell that is selected for an operation may be labeled as a targeted cell and the one that is not selected may be labeled as a neighbor cell.

According to some embodiments, joining or connecting groups of memory gates (MG) to each other may be utilized to save area and power. Typically it may be considered easier to connect neighboring MGs. It is understood that for that purpose of this application, neighboring cells are adjacent cells that also have a shared SL. For reasons discussed in this application relating to program disturb effects between neighboring cells, it is suggested to replace the typical MG connectivity and to connect MGs in a shifted routing configuration so that neighboring cells (which by definition have a shared SL) do not share a common signal/voltage applied to their MGs.

Furthermore, according to some embodiments, edge architecture of an NVM array may be optimized so that neighbor disturb effect is reduced, while taking into account of area limitation considerations. Since in a shifted routing configuration, MGs of neighboring cells having a shared SL are not connected to each other, it is understood that edge memory cells may need a special edge configuration. An edge configuration connecting MGs of two or more edge memory cells (on opposing edges of an array) to each other is described in FIG. 7B. Furthermore, where multiple pairs of memory gates are connected in the array an edge configuration where two edge memory cells are connected to a pair of center memory cells is understood and a conducting bridge may be utilized to avoid cutting of various array connecting lines.

It is understood that MGs of neighboring cells which are not connected as will be shown in following figures, a shifted configuration may also be termed "unconnected" MGs. Accordingly, MGs of a targeted cell and a neighbor cell may be unconnected.

For the purpose of this application, it is understood that connected lines may refer to electrical lines either electronically connected or configured to be driven to the same voltage. It is understood that shared lines are physically connected, or in other words are physically the same line or adjoining lines. Accordingly, unconnected lines are not electronically connected and unshared lines are not the same physical line and/or not adjoining lines.

Turning to FIG. 2, depicted is a schematic of an example operating details for a program operation of NVM cells, such as the eCT™ cells, for both a selected target cell and an unselected neighbor cell. FIG. 2 also includes a cut out of an associated array including a target and a neighbor cell. Selected cells or target cells are the ones that operation is to be applied to (Read, Program and/or Erase). Unselected cells are the ones that operation is not intended to be applied to. It is understood that during a program operation, voltage signals applied to (a) a MG is a high voltage which may be in the approximate range of 5-10V and a low voltage may be in the approximate range of 0-5V, (b) for a select gate (SG), a high voltage may be in the approximate range of 0.65-1.35V and a low voltage may be approximately 0V, (c) for a SL a high voltage may be in the approximate range of 3-7V and a low voltage may be approximately 0V, and (d) the BL may be at a programming voltage or current, which is a supply of voltage or current to cause the cell to be programmed. In one embodiment, the voltage and/or current magnitude is typically predetermined for each NVM array, and may be denoted by Vpgm, or V@Ipgm or Ipgm. As known in the art, the operating voltage ranges described above may vary and be technology dependent.

Turning to FIG. 3, depicted are two NVM cells 300, such as eCT™ cells, and an illustration of a program disturb is shown. Each of the cells is similar to embodiments, eCT™ 100, as described in FIG. 1 and FIG. 2. The two NVM cells 300 include target cell 304 and neighbor cell 305. The two NVM cells 300 have a shared SL 306 and a mirrored orientation to one another. Each of the target cell 304 and neighbor cell 305 has a similar structure to NVM cell or split gate cell 100 illustrated in FIG. 1. In one embodiment, each of the target cell 304 and neighbor cell 305 further includes MG, SG, BL, and a shared SL 306. A Transient Program Disturb (TPD) effect that neighbor cell 305 may be subjected to will now be discussed. In one embodiment, as best shown in FIG. 3, MGs of target cell 304 and neighbor cell 305 are connected to or applied a same voltage. And in a program operation, it may be a high voltage as discussed earlier. Since SG of the neighbor cell 305 is connected to a low voltage, neighbor cell 305 is not supposed to be programmed. A TPD mechanism originates from target cell 304 which is being programmed. Hot electrons in the vicinity of the injection area induce impact ionization, creating electron-hole pairs. The holes, accelerated by the strong positive vertical field become hot and induce secondary impact ionization relatively far from the targeted MG (the programmed cell MG). These secondary electrons are then subjected to the strong positive MG bias of the neighbor cell 305. In one embodiment, neighbor cell 305 may be physically adjacent to target cell 304, which is being programmed. Consequently, secondary electrons may accelerate and inject into the oxide-nitride-oxide (ONO) layer of the neighbor cell 305. The injection of secondary electrons may partially program neighbor cell 305. In addition punch-through in neighbor cell 305 induces unintential injection into the ONO layer, which is also referred to as punch-through disturb or PDB. The TPD mechanism requires two serial impact ionization processes, and therefore its probability is very sensitive to the geometrical path between the adjacent cells. For clarity, specific voltage levels are shown in the example, however, it is understood that TPD is prevalent in different programming voltages.

It is understood that a disturbed cell, such as neighbor cell 305, is a cell that is not intended to be programmed in a specific cycle. However, due to architectural and physical characteristics of the NVM array as well as the voltages being applied to the non-selected cell and to adjacent cells (which may be selected to be programmed), undesirable changes in the charges stored in the non-selected cell, such as neighbor cell 305, may occur. Accordingly, the data stored in the disturbed cell may be corrupted so that an erased cell, such as neighbor cell 305, may be determined to be programmed and vice versa, or an incorrect program level may be detected for multi-bit memory cells.

Figures 4A, 4B:
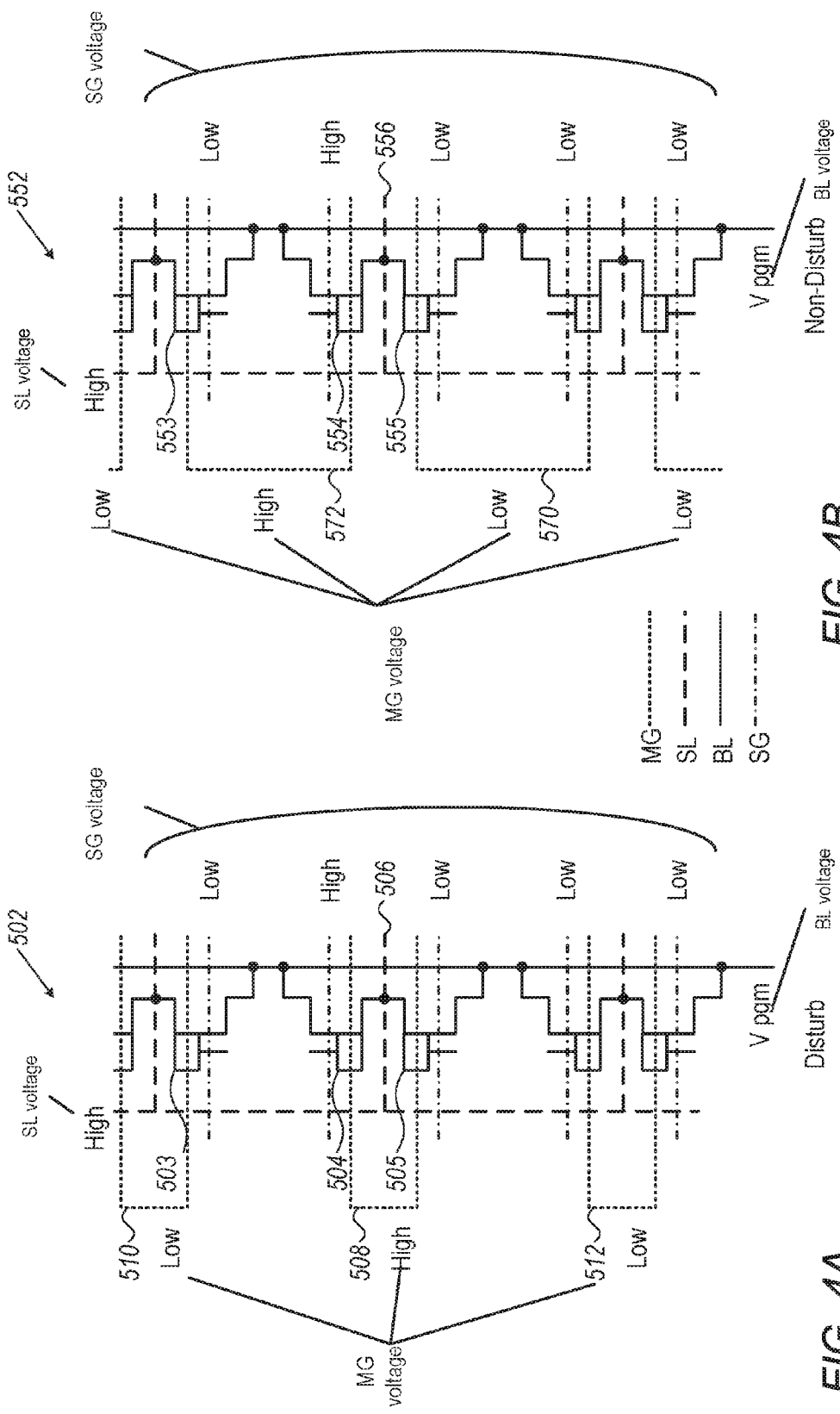
FIG. 4A depicts a cut-out of a segment of an array which may be subjected to program disturbs.
FIG. 4B depicts a cut-out of a segment of an array for which program disturb is inhibited.

Turning to FIG. 4A, depicted is a cut-out of a segment of an array 502 which may suffer from program disturbs. Memory cell 504 may be considered an even cell and adjacent cells from either of its side (memory cells 503 and 505) may be considered odd cells (or vice versa). It is understood that memory cells 504 and 505 are substantially similar to cells 304 and 305 of FIG. 3, respectively. Memory cells 504 and 505 includes shared SL 506, and have a common first MG control 508. In one embodiment, adjacent cell (503) which does not share a SL 506 with memory cells 504 are not neighboring cells. Memory cell 503 has a second MG control 510 and a separated SL. Accordingly, these memory cell array have a natural WL configuration.

According to some embodiments, if cell 504 is selected for a program operation while cell 505 is unselected for such operation, cell 505 may be subjected to program disturb or punch-through disturb, as discussed in FIG. 3. It is further understood that if cell 504 is a target cell, then cell 505 is considered a neighbor cell because they have a shared SL 506. However, cell 503, despite being physically adjacent to cell 504, is not considered a neighbor cell because they do not have a shared SL. Discussion of voltage ranges in FIG. 2 is applicable to FIG. 4A. It is understood that MG control 512 may be physically connected to MG control 510 or both may be driven to the same value (voltage or current).

Turning to FIG. 4B depicted is a cut-out of a segment of an array 552 where program disturbs of unselected memory cells are inhibited. It is understood that memory cells 553-555 are substantially similar to memory cells 503-505 of FIG. 4A. However MGs 570 and 572 are shifted MGs of segment of array 552. Accordingly, neighboring cells 554 and 555 that have shared SL 556 do not share a MG control. For example, cell 554 is targeted to be programmed and MG control 572 goes High (voltage), neighbor cell 555 may not be subjected to program disturb because it has a unconnected/separated MG control 570 that goes Low (voltage). In other words, program disturb of neighbor memory cell 555 is inhibited or suppressed. Target cell 554 and neighbor cell 555 may be termed a regular neighboring pair, as neither of the cells is at the edge of the array. Furthermore, it is understood that in some modes of operation, cell 555 may be the targeted cell in which case cell 554 would be the disturbed cell. Cell 555 and cell 554 may also be termed neighboring cells while cells 554 and 553 having unshared SLs are non-neighboring adjacent cells. Discussion of voltage ranges discussed with regard to FIG. 2 is applicable to FIG. 4B.

Turning to FIG. 5A depicted is a schematic memory cell such as targeted cell 602 including operation voltages during a program operation. Targeted cell 602 is substantially similar to memory cell 504 of FIG. 4A and/or memory cell 554 of FIG. 4B. During a program operation a targeted cell SG may be at a high voltage, MG of targeted cell may be at a high voltage, SL of targeted cell may be at a high voltage, BL of targeted cell may be at a Vpgm voltage. Voltage ranges discussed with regard to FIG. 2 are applicable to FIG. 5A.

Turning to FIG. 5B depicted is a schematic including operation voltages during a program operation for neighbor disturbed cell 604, it is understood that neighbor disturbed cell 604 is substantially similar to memory cell 505 of FIG. 4A, and accordingly, neighbor disturbed cell 604 in an array may have a joint MG control with a target cell such as targeted cell 602. During a program operation a neighbor disturbed cell SG may be at a low voltage, neighbor disturbed cell MG may be at a high voltage, neighbor disturbed cell SL may be at a high voltage, neighbor disturbed cell BL may be supplied with Vpgm voltage. In one embodiment, targeted cell 602 and neighbor disturbed cell 604 may have a shared SL. As stated, neighbor cell SG may be at a low voltage to close off neighbor disturbed cell 604 for programming. Despite the low SG voltage, electrons may still reach the ONO layer of neighbor disturbed cell 604 during programming of target cell 602 as a result of a program disturb such as TPD or PDB (as previously discussed with regard to FIG. 3). Voltage ranges discussed with regard to FIG. 2 are applicable to FIG. 5B.

Turning to FIG. 5C depicted is a schematic including operation voltages during a program operation for neighbor undisturbed cell 606, it is understood that neighbor undisturbed cell 606 is substantially similar to memory cell 555 of FIG. 4B, and accordingly, neighbor undisturbed cell 606 in an array may have a shifted MG control to targeted cell 602. During a program operation neighbor undisturbed cell SG may be at a low voltage, a neighbor undisturbed cell MG may be at a low voltage, a neighbor undisturbed cell SL may be at a high voltage, a neighbor undisturbed cell BL may be at a Vpgm voltage. In one embodiment, targeted cell 602 and neighbor undisturbed cell 606 may have a shared SL. In one embodiment, low voltage signal is applied to neighbor undisturbed cell MG in order to close it, thus neighbor undisturbed cell 606 does not suffer from a substantial program disturb. Furthermore, the neighbor undisturbed SG may have a low value which may also be termed an inhibit state to further inhibit program disturb on that cell Voltage ranges discussed with regard to FIG. 2 are applicable to FIG. 5C.

Figure 6:
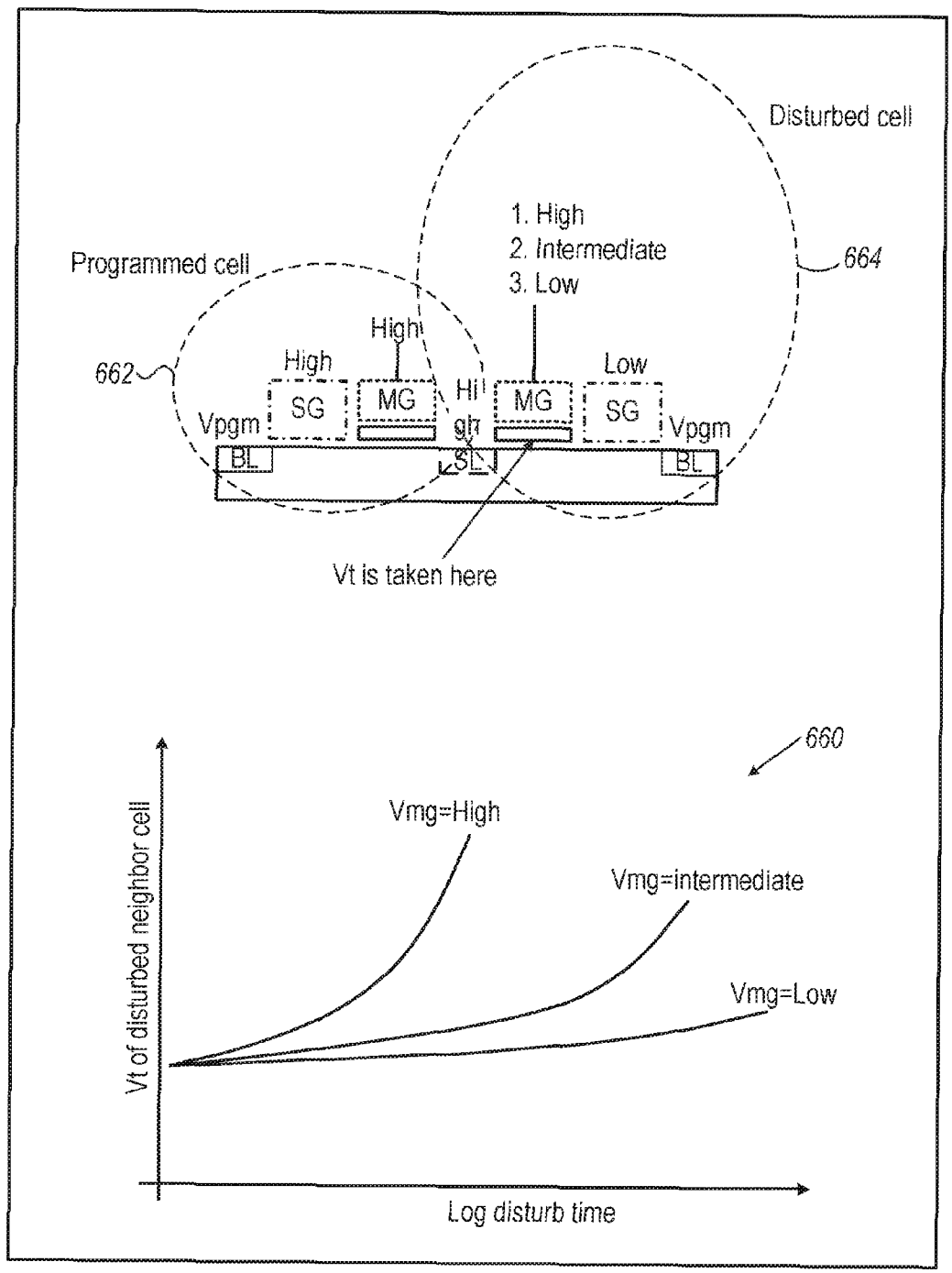
FIG. 6 depicts an example graph reflecting threshold voltages of a neighbor cell and a schematic of a target and neighbor cell accordingly.

Turning to FIG. 6 depicted is a diagram reflecting shift of the threshold voltage (Vt) of neighbor cell at different memory gate voltages and a schematic of programmed cell 662 and disturbed neighbor cell 664. Graph 660 depicts increase of Vt (which correlates to charge stored in the disturbed neighbor cell) as disturbed cell 664 memory gate voltage (Vmg) increases. It is shown that the higher MG value, the more severe program disturb the neighbor memory cell is subjected to. For a low Vmg value, the effect of program disturb to the neighbor cell may be mitigated. Voltage ranges discussed in earlier paragraph with regard to FIG. 2 are also applicable to FIG. 6. However with regard to MG for this example only it is understood that High is 7-10V, Low is 0-2V and Intermediate is 2-7V.

Figure 7A:
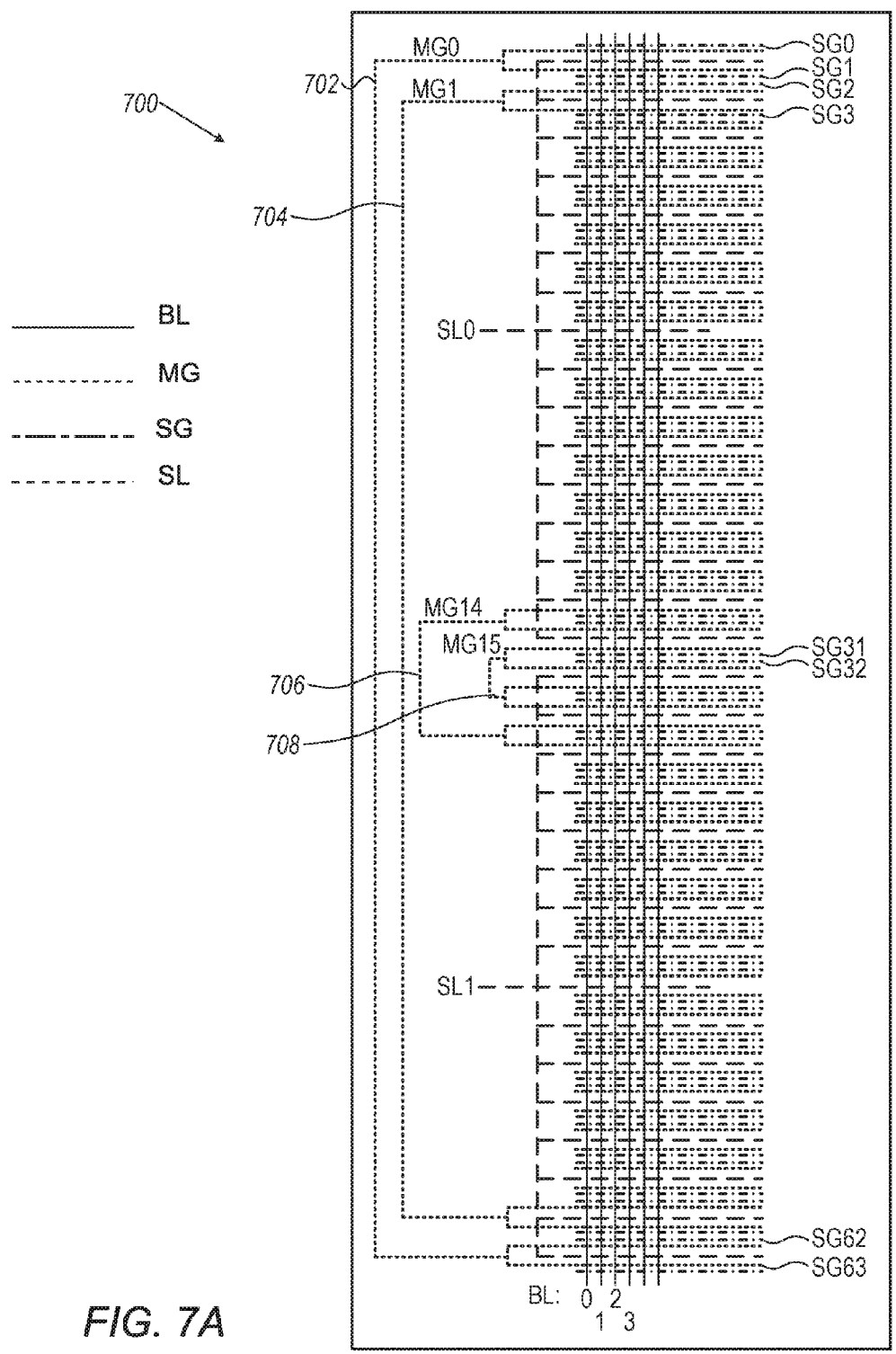
FIG. 7A depicts an example of an NVM array with a standard memory gate (MG) configuration.

Turning to FIG. 7A depicted is an example array 700 with a standard MG configuration. According to some embodiments, in accordance with the standard configuration: two or more MGs may be connected via lines so that the MGs are physically or electronically connected, so that a separate driver is not needed for each MG or group of MGs. In the standard configuration, MGs of neighboring cells or physically adjacent cells with a joint or shared SL are connected as it is the simplest in terms of connection layout. As schematically depicted in array 700, MGs of neighboring cell 0 and cell 1 are connected via MG0 (702) as well as edge neighboring cell 62 and cell 63, neighboring cell 2 and cell 3 are connected via MG1 (704) as well as neighboring cell 60 and 61. MG14 (706) and MG15 (708) each depict connectivity of center neighboring cell pairs. These neighboring cells may be termed target and neighbor cells, similar to those described in FIG. 4A. As discussed above in detail, a standard configuration may lead to substantial program disturb in unselected neighbor cells, at least during programming. For example, when cell 0 is selected to be programmed and cell 1 is not, MG0 may apply a high voltage to both MGs of cells 0 and 1. In this case, as discussed, program disturb may happen to unselected neighbor cell 1.

Figure 7B:
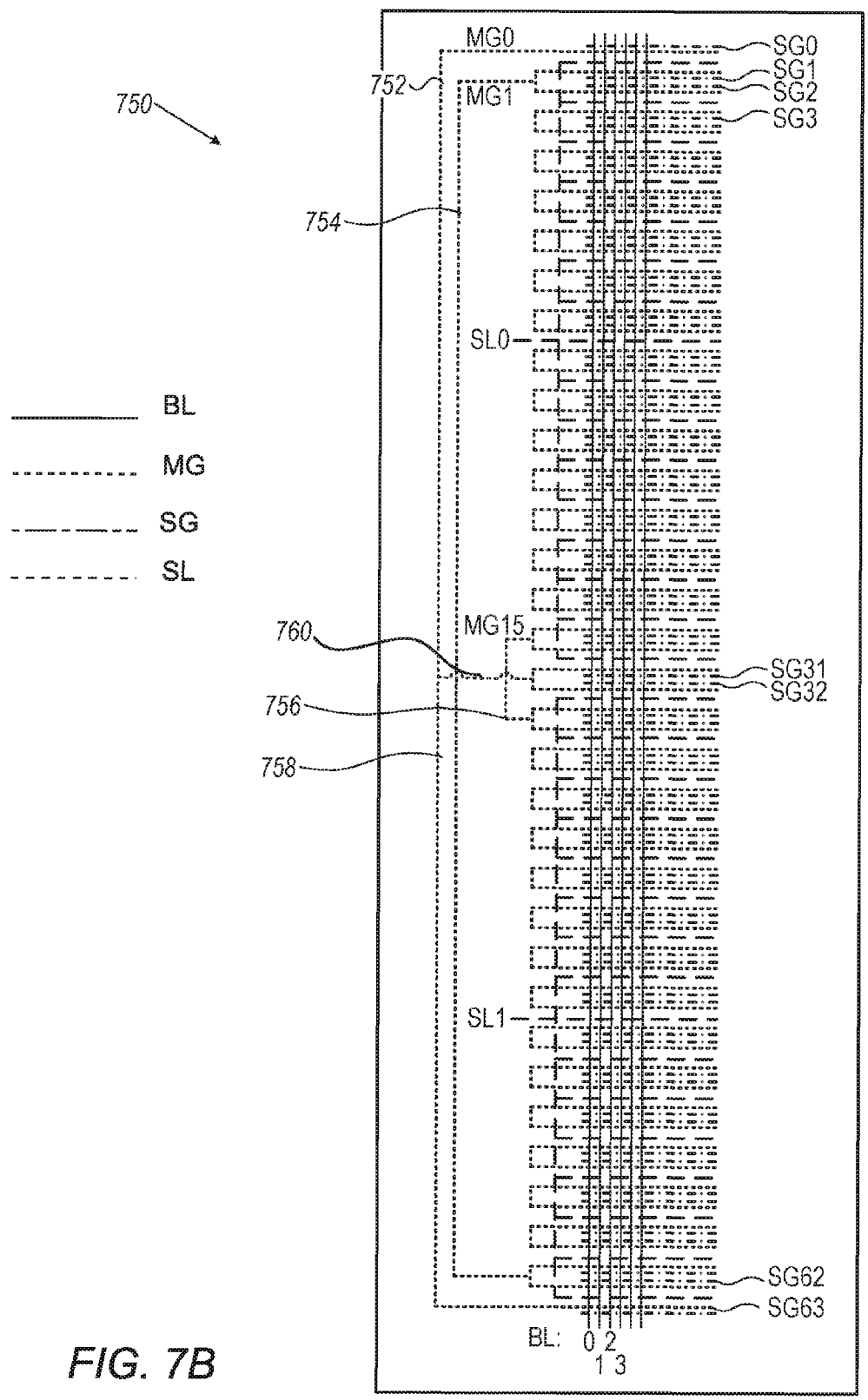
FIG. 7B depicts another example of an NVM array with a shifted MG configuration.

Turning to FIG. 7B, depicted is an example improved array 750 with a shifted WL (or MG) configuration. Compared to a standard configuration, the shifted WL (or MG) configuration may reduce program disturb effects on unselected cells. For both FIGS. 7A and 7B, although a specific size of array is shown for clarity, as is known in the art, a wide variety of size and configuration are possible. Accordingly, 64 SG controls are shown. 512 BL are depicted, and 16 MG are shown and more, however the invention is not limited to these amounts. Furthermore, the array is depicted as having two source line controls (SL0 and SL1), however it is understood that the decision on how many source lines to include is a design choice depending on die size, power consumption and other factors. As depicted in FIG. 7B, a shifted configuration is shown so that if a cell is targeted, MG of its neighbor cell's can be driven to be substantially low. The memory cells are connected in groups of memory cell gates with a shared/common driver, while maintaining the shifted configuration. In one embodiment, two or more MGs of physically adjacent memory cells that do not share one SL may be connected or having a common MG voltage applied to. Accordingly, cell 0 is connected to cell 63 via MG0 (752) as well as to non-neighboring cells of the center (cell 31 and cell 32). Cell 1 and Cell 2 having unshared SL are connected via MG1 (754) and further connected to non-neighboring cell 62 and 61.

With regard to FIGS. 7A and 7B for purpose of clarity arrays 700 and 750 are shown in an array level schematic, location of cell 0-cell 63 is understood by depicted connectivity of the MG, SL, BL, etc. It is understood that cell 0-cell 63 of FIG. 7A are substantially similar to cell 0-cell 63 of FIG. 7B, but are different with regard to their MG (or WL) connectivities. Reference to FIG. 4A would clarify the cell level view for FIG. 7A and reference to FIG. 4B would clarify the cell level view for FIG. 7B. For example, if cell 0 is selected for programming and its neighboring cell 1 is not, cell 1 may not be subjected to program disturb since MGs of cell 0 and cell 1 are not connected, MG of cell 0 is driven by MG0 which may go high for programming while MG of cell 1 is driven by MG1 which may go low, or at least a different voltage. In summary, adjacent non-neighboring cells, which do not shared one SL may share a common MG connection or routing.

With regard to FIG. 7B, according to some embodiments, an edge MG routing in accordance with an edge shifted MG is shown. Since the edge memory cells, such as cell 0, do not have an adjacent non-neighbor cell, they are connected to the memory cells of the other array edge. Furthermore, these edge pairs may be connected to additional regular central pairs to complete a group of memory cells with a shared driver (a memory gate driver group). Additional configurations are possible. In order to produce the depicted configuration and reach the memory cell gates in the center of the array without shorting or cutting the other control lines (such as other MG controls) a conducting line bridge 760 which may be made of polysilicon or other metal may be adopted.

Observation of changes of connectivity between MG0-MG15 (702-708) of FIG. 7A and MG0-MG15 (752-758) of FIG. 7B will schematically clarify the statements made above.

Figure 8A:
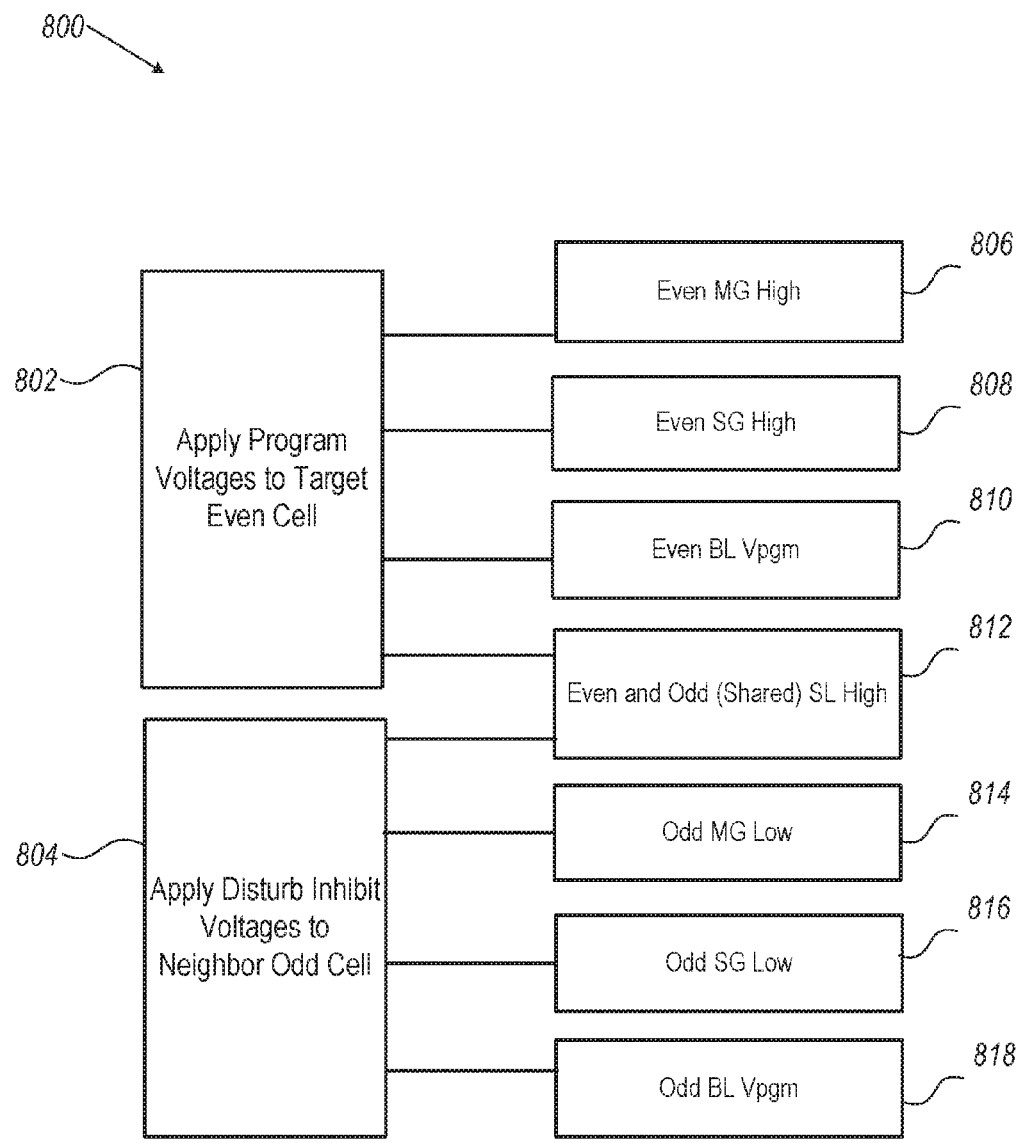
FIGS. 8A and 8B each depicts a method of programming a memory device.
Figure 8B:
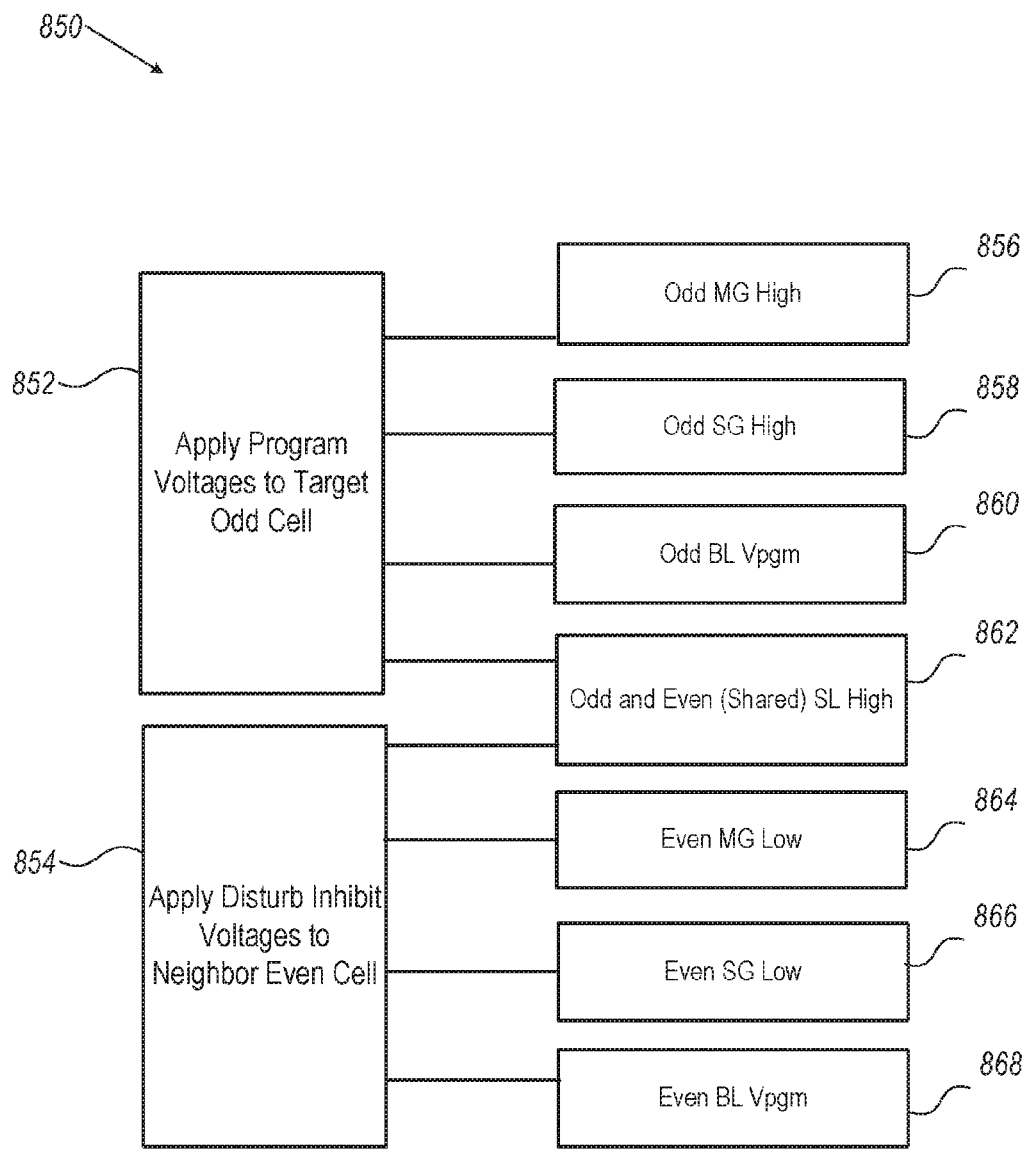

Turning to FIGS. 8A and 86 depicted are methods of programming a target memory device while inhibiting a program disturb on a neighbor memory device (800 and 850). Turning to method 800, if the target device is an even cell then the neighbor device is an odd cell. Program voltages are applied to the even cell (802) and disturb inhibit voltages are applied to the odd cell (804). Accordingly, a high voltage may be applied to the even cell's MG (in the approximate range of 5-10V) (806), a high voltage may be applied to the even cell's SG (in the approximate range of 0.65-1.35V) (808), a program supply may be provided to the even cell's BL (Vpgm, Ipgm or V@Ipgm) (810) and the physically shared select line of the odd and even cells may be supplied with a high voltage (in the approximate range of 3-7V) (812). Furthermore, a low voltage may be applied to the odd cell's MG (in the approximate range of 0-5V) (814), a low voltage may be applied to the odd cell's SG (approximately 0V) (816), a program supply may be provided to the odd cell's BL (Vpgm, Ipgm or V@Ipgm) or the BL may substantially be turned off (depending on array architecture (818).

Turning to method 850, it is understood that method 850 is substantially similar to step 800 and that steps 852-868 are substantially similar to steps 802-818. However, method 850 describes an odd memory cell being programmed (step 852) and an even memory cell having a disturb inhibit being applied to it. This method is meant to emphasize that each even and each odd cells may be a targeted cell and the neighbor odd or even (appropriately) memory cell has a disturb inhibit applied to it when the target is being programmed.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A memory device, comprising:
a plurality of pairs of non-volatile memory cells arranged in rows and columns, each pair including, a first memory cell including a first memory gate and a first select gate, and a second memory cell including a second memory gate and a second select gate, wherein the first and second memory cells are disposed in a same column and share a source region disposed between the first and second memory gates, and wherein the first and second memory gates are not connected to one another, and
wherein the first memory gate of a first pair of non-volatile memory cells is connected to another memory gate in a second pair of non-volatile memory cells of the same column on a side opposite from the second memory gate of the first pair of non-volatile memory cells, and the second memory gate is connected to another memory gate in a third pair non-volatile memory cells of the same column on a side opposite from the first memory gate.

2. The memory device of claim 1, wherein the first and second memory cells include a mirrored orientation, and the first and second memory gates face one another.

3. The memory device of claim 1, wherein when the first memory cell is selected for programming and the second memory cell is not selected for the programming, the first and second memory gates are configured to receive a first voltage and a second voltage respectively, and wherein the first and second voltages are different voltages.

4. The memory device of claim 3, wherein the first voltage is a high voltage in an approximate range of 5 V to 10 V, and the second voltage is a low voltage in an approximate range of 0 V to 5 V.

5. The memory device of claim 3, wherein the first select gate is configured to receive a high voltage to select the first memory cell for programming, and the second select gate is configured to receive a low voltage to inhibit the second memory cell for the programming.

6. The memory device of claim 1, wherein the first and second memory cells include split gate memory cells.

7. The memory device of claim 1, wherein each of the first and second memory gates comprises a charge trapping layer.

8. The memory device of claim 1, wherein the first and second memory cells are multi-bit memory cells.

9. A method, comprising:
operating a non-volatile memory array, wherein the non-volatile memory array includes a plurality of pairs of non-volatile memory cells arranged in rows and columns, each pair including,
a first memory cell including a first memory gate and a first select gate, and a second memory cell including a second memory gate and a second select gate, wherein the first and second memory cells are disposed in a same column and share a source region disposed between the first and second memory gates, and wherein a bit line is disposed adjacent to the first select gate and the second select gate, wherein the first and second memory gates are not connected to one another, and wherein the first and second memory gates are each connected to at least one other memory gate of at least one other pair of non-volatile memory cells of the same column;
providing a high select voltage to the first select gate to select the first memory cell for programming;
providing a low select voltage to the second select gate to deselect the second memory cell for programming; and
providing a high voltage to the first memory gate and a low voltage to the second memory gate,
wherein during programming of the first memory cell: the high select voltage is in an approximate range of 0.65 V to 1.35 V, and the low select voltage is approximately 0 V; the high voltage applied to the first memory gate is in an approximate range of 5 V to 10 V, and the low voltage applied to the second memory gate is in an approximate range of 0 V to 5 V; and the high source voltage is in an approximate range of 3 V to 7 V.

10. The method of claim 9, wherein the low voltage provided to the second memory gate during programming of the first memory cell is configured to inhibit transient program disturb of the second memory cell.

11. The method of claim 9, further comprising: providing, during programming of the first memory cell a program voltage to the bit line.

12. A non-volatile memory array, comprising:
a plurality of memory cell pairs arranged in rows and columns, each of the plurality of memory cell pairs including a first and second memory cells, wherein,
the first memory cell includes a first memory gate and a first select gate, and the second memory cell includes a second memory gate and a second select gate, the first and second memory cells share a source line disposed between the first and second memory gates, and the first and second memory gates of a same memory cell pair are not electrically coupled to one another, wherein the first memory gate of at least one memory cell pair share a memory gate routing with the second memory gate of an adjacent memory cell pair of a same column, and wherein first memory gate of the at least one memory cell pair is not separated from the second memory gate of the adjacent memory cell pair by another memory gate.

13. The memory array of claim 12, wherein the first and second memory cells of the same memory cell pair include a mirrored orientation, and the first and second memory gates faces one another.

14. The memory array of claim 12, wherein the first and second memory gates of the same pair of memory pair do not share a memory gate routing, and are configured to receive different voltages.

15. The memory array of claim 12, wherein memory cell pairs of a same column do not include common source line.

16. The memory array of claim 12, wherein the first connector is further coupled to at least one other first and second memory gates of memory cell pairs of the same column via a conducting line bridge.

17. The memory array of claim 12, wherein memory cell pairs of a same column share a common bit line.

* * * * *